United States Patent
Wolk et al.

(10) Patent No.: US 6,485,884 B2
(45) Date of Patent: Nov. 26, 2002

(54) METHOD FOR PATTERNING ORIENTED MATERIALS FOR ORGANIC ELECTRONIC DISPLAYS AND DEVICES

(75) Inventors: Martin B. Wolk, Woodbury, MN (US); Yong Hsu, Woodbury, MN (US); Hassan Sahouani, Hastings, MN (US); John S. Staral, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/844,100

(22) Filed: Apr. 27, 2001

(65) Prior Publication Data

US 2002/0160296 A1 Oct. 31, 2002

(51) Int. Cl.$^7$ .............................. G03F 7/34; G03F 7/11; G03F 7/40
(52) U.S. Cl. ................. 430/200; 430/270.1; 430/271.1; 430/964
(58) Field of Search ............................. 430/200, 271.1, 430/20, 270.1, 964

(56) References Cited

U.S. PATENT DOCUMENTS

| | | | |
|---|---|---|---|
| 4,252,671 A | 2/1981 | Smith | |
| 5,166,024 A | 11/1992 | Bugner et al. | |
| 5,256,506 A | 10/1993 | Ellis et al. | 430/201 |
| 5,351,617 A | 10/1994 | Williams et al. | |
| 5,688,551 A | 11/1997 | Littman et al. | 430/200 |
| 5,693,446 A | 12/1997 | Staral et al. | 430/200 |
| 5,695,907 A | 12/1997 | Chang | 430/200 |
| 5,707,745 A | 1/1998 | Forrest et al. | 428/432 |
| 5,710,097 A | 1/1998 | Staral et al. | 430/200 |
| 5,725,989 A | 3/1998 | Chang et al. | 430/200 |
| 5,904,961 A | 5/1999 | Tang et al. | 430/200 |
| 5,998,085 A | 12/1999 | Isberg et al. | 430/200 |
| 6,114,088 A | 9/2000 | Wolk et al. | 430/200 |
| 6,140,009 A | 10/2000 | Wolk et al. | 430/200 |
| 6,165,543 A | 12/2000 | Otsuki et al. | 430/199 |
| 6,194,119 B1 | 2/2001 | Wolk et al. | 430/200 |
| 6,214,520 B1 | 4/2001 | Wolk et al. | 430/200 |
| 6,242,152 B1 * | 6/2001 | Staral et al. | 430/200 |
| 6,284,425 B1 * | 9/2001 | Staral et al. | 430/200 |

FOREIGN PATENT DOCUMENTS

| | | |
|---|---|---|
| EP | 0 851 714 A2 | 7/1998 |
| EP | 1 074 600 A2 | 2/2001 |
| EP | 1 081 774 A2 | 3/2001 |
| JP | Hei 101998/57214 | 9/1999 |
| JP | 2000-195673 | 7/2000 |
| WO | WO 00/14777 | 3/2000 |

OTHER PUBLICATIONS

F. Garnier, G. Horowitz, X. Peng and D. Fichou, "An All–Organic "Soft" Thin Film Transistor With Very High Carrier Mobility," *Adv. Mater.*, vol. 2, pp. 592–594 (1990).

(List continued on next page.)

*Primary Examiner*—Richard L. Schilling
(74) *Attorney, Agent, or Firm*—Bruce E. Black (57) ABSTRACT

The present invention provides a method for pattering oriented materials to make organic electronic displays or devices. The method includes selective thermal transfer of an oriented electronically active or emissive material from a thermal transfer donor sheet to a receptor. The method can be used to make organic electroluminescent devices and displays that emit polarized light. The method can also be used to make organic electronic devices with enhanced charge mobility properties. The present invention also provides donor sheets for use with the method, and methods for making donor sheets that include transfer layers having oriented electronically active organic materials.

21 Claims, 3 Drawing Sheets

OTHER PUBLICATIONS

A. Kimball and A. B. Walker "Transport properties of highly aligned polymer light–emitting diodes," *Phys. Rev. B.* vol. 63, p. 012201–1(2000).

Christroph Weder, Christian Sarwa, Cees Bastiaansen, and Paul Smith "Highly Polarized Luminescence from Oriented Conjugated Polymer/Polyethylene Blend Films," *Advanced Materials*, vol. 9, pp. 1035–1039 (1997).

M. Schadt, K. Schmitt, V. Kozinkov and V. Chigrinov "Surface–Induced Parallel Alignment of Liquid Crystals by Linearly Polymerized Photopolymers," *Appl. Phys.*, vol. 31, pp. 2155–2164 (1992).

M. Grell and D. D.C. Bradley, "Polarized Luminescence from Oriented Molecular Materials," Adv. Materials, vol. 11, pp. 895–905 (1999).

M. Jandke, P. Strohriegl, J. Gmeiner, W. Britting, and M. Schoerer, "Polarized Electroluminescence from Rubbing–Aligned Poly(p–phenylenevinylene)" *Adv. Mater.*, vol. 11, pp. 1158–1160 (1999).

S.H. Chen, D. Katis, A.W. Schmid, J.C. Mastrangelo, T. Tsutsuiand T.N. Blanton, "Circularly polarized light generated by photoexcitation of luminophores in glassy liquid–crystal films," *Nature*, vol. 397, pp. 506–508 (Feb. 11 1999).

M. Grell, W. Knoll, D. Lupo, A. Meisel, T. Miteva, D. Neher, H. Nothofer, U. Scherf and A. Yasuda "Blue Polarized Electroluminescence From a Liquid Crystalline Polyfluroene," *Adv. Mat.*, vol. II, No. 8, pp. 671–675 (1999).

M. Nishikawa "Design of Polyimides for Liquid Crystal Alignment Films," *Polym. Adv. Technol.*, vol. 11, pp. 404–412 (2000).

L. Chen, Z. Bao, B.J. Sapjeta, A. Lovinger and B. Crone "Polarized Electroluminescence from Aligned Chromophores by the Friction Transfer Method," *Adv. Maters*, vol. 12, No. 5, pp. 344–347 (2000).

M. Oda, H. Nothofer, G. Lieser, U. Scherf, S. Meskers and D. Neher "Circularly Polarized Electroluminescence from Liquid–Crystalline Chiral Polyfluorenes," *Adv. Maters.*, vol. 12, No. 5, pp. 362–365 (2000).

K. Whitehead, M. Grell, D.D.C. Bradlye, M. Inbasekaran, and E.P. Woo "Polarized Emission From Liquid Crystal Polymers," *Synthetic Metals*,111–112, pp. 181–185 (2000).

K. Clauswitz, F. Geffarth, A. Greiner, G. Lussem, J.H. Wendorff "Polarized Electroluminescent from Liquid Crystalline Polymers," *Synthetic Metals* 111–112, pp. 169–171 (2000).

M. Oda, S.C.J. Meskers, H.G. Nothofer, U. Scherf, D. Neher "Chiroptical Properties Of Chiral–Substituted Polyfluorenes," *Synthetic Metals*, 111–112, pp. 575–577 (2000).

M. Grell, D.D.C. Bradley, M. Inbsekaran, G. Ungar, K.S. Whitehead and E. P. Woo, "Intrachain Ordered Polyfluorene," *Synthetic Metals*, 111–112, pp. 579–581 (2000).

T. Miteva, A. Meisel, M. Grell, H.G. Nothofer, D. Lupo, A. Yasuda, W. Knoll, L. Kloppenburg, U.H.F. Bunz, U. Scherf, D. Neher "Polarized Electroluminescence from Highly Aligned Liquid Crystalline Polymers," *Synthetic Metals*, 111–112, pp. 173–176 (2000).

M. Grell, D.D.C. Bradley and K. Whitehead "Materials and Devices for Polarized Electroluminescence," *Korean Physical Society*, vol. 36, No. 6, pp. 331–336 (Jun. 2000).

E.K. Miller, C.Y. Yang and A. Heeger "Polarized Ultraviolet Absorption By A Highly Oriented Dialkyl Derivative Of Poly(paraphenylene vinylene)," *The American Physical Society*, vol. 62, No. 11, pp. 6889–6891.

C. Kocher, A. Montali, P. Smith and C. Weder "Patterning of Oriented Photofunctional Polymer Systems Through Selective Photobleaching," *Adv. Funct. Maters*, vol. 11, No. 1 (Feb. 2001).

M. Grell, M. Oda, K. Whitehead, A. Asimakis, D. Neher and D.D.C. Bradley "A Compact Device for the Efficient, Electrically Driven Generation of Highly Circularly Polarized Light," *Adv. Maters.*, vol. 13, No. 8, pp. 577–577–580 (Apr. 18, 2001).

U.S. patent application Ser. No. 09/426,288, Dual Color Guest–Host Polarizers and Devices Containing Guest–Hist Polarizers, filed Oct. 25, 1999.

U.S. patent application Ser. No. 09/473,114, Thermal Transfer Donor Element Having A Heat Management Underlayer, filed Dec. 28, 1999.

U.S. patent application Ser. No. 09/474,002, Thermal Mass Transfer Donor Element, filed Dec. 28, 1999.

U.S. patent application Ser. No. 09/451,984, Thermal Transfer Of Microstructured Layers, filed Nov. 30, 1999.

U.S. patent application Ser. No. 09/563,597, Thermal Transfer Of Crosslinked Materials From A Donor To A Receptor, filed May 3, 2000.

U.S. patent application Ser. No. 09/662,980, Selective Thermal Transfer Of Light Emitting Polymer Blends, filed Sep. 15, 2000.

* cited by examiner

METHOD FOR PATTERNING ORIENTED MATERIALS FOR ORGANIC ELECTRONIC DISPLAYS AND DEVICES

This invention relates to organic electroluminescent displays and organic electronic devices.

BACKGROUND

Pattern-wise thermal transfer of materials from donor sheets to receptor substrates has been proposed for a wide variety of applications. For example, materials can be selectively thermally transferred to form elements useful in electronic displays and other devices. Specifically, selective thermal transfer of color filters, black matrix, spacers, polarizers, conductive layers, transistors, phosphors, and organic electroluminescent materials have all been proposed.

SUMMARY OF THE INVENTION

The ability to selectively thermally transfer organic electronically active materials can allow a wide variety of organic electronic devices to be made that cannot currently be made by conventional means. For example, while emission of polarized light from oriented organic electroluminescent materials has been demonstrated in the literature, the ability to pattern devices or to make displays utilizing organic polarized light emitting devices has not been shown. The present invention provides methods for patterning oriented electronically active organic materials, and thus for the first time enables the fabrication and manufacture of patterned organic electronic displays and devices. Such devices include organic transistors and other such electronic devices that have oriented conductive or semiconductive polymer layers, for example to enhance charge mobility properties in the device. Other such devices include organic electroluminescent devices and pixilated displays that incorporate oriented organic emissive materials, for example to emit linearly or circularly polarized light.

In one aspect, the present invention provides a process for making an organic electroluminescent device by selectively thermally transferring a transfer layer comprising an oriented organic emissive material from a donor sheet to a receptor substrate that has a first electrode, and forming a second electrode so that the oriented organic emissive material is positioned between the first and second electrodes, wherein the device is capable of emitting polarized light when activated.

In another aspect, the present invention provides a process for making an organic electronic device by selectively thermally transferring a transfer layer comprising an oriented electronically active polymer from a donor sheet to a device substrate, and connecting the oriented electronically active polymer layer on the device substrate to other layers of the organic electronic device to form a completed device.

In yet another aspect, the present invention provides a donor sheet comprising a selectively thermally transferable transfer layer comprising an oriented organic emissive material capable of emitting polarized light when suitably disposed in an organic electroluminescent device.

In still another aspect, the present invention provides a donor sheet that includes a substrate, an alignment layer, a light-to-heat conversion layer disposed between the substrate and the alignment layer for converting incident imaging radiation into heat, and a transfer layer comprising an oriented light emitting polymer coated onto the alignment layer and capable of being selectively thermally transferred from the donor sheet to a proximately located receptor.

In another aspect, the present invention provides a method of making a donor sheet by providing a donor substrate and forming a transfer layer adjacent to the substrate, the transfer layer including an oriented electronically active organic material capable of being selectively thermally transferred from the donor sheet to a proximately located receptor while substantially maintaining the orientation of the oriented electronically active organic material.

BRIEF DESCRIPTION OF THE DRAWINGS

The invention may be more completely understood in consideration of the following detailed description of various embodiments of the invention in connection with the accompanying drawings, in which.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention.

DETAILED DESCRIPTION

The present invention contemplates organic electronic devices and displays that include oriented electronically active organic materials, and in particular that contain oriented conducting, semiconducting, or light emitting polymers. According to the present invention, electronically active polymers and/or organic emissive materials can be oriented and patterned, for example by selective thermal transfer from a donor sheet, to form layers or components of organic electronic devices. Examples of organic electronic devices that can be made include organic transistors, organic electroluminescent (OEL) devices, and the like.

In one embodiment, the present invention contemplates OEL devices and displays that emit polarized light, and methods of making polarized light emitting OEL devices and displays. Some organic light emitting materials have been shown to be capable of emitting polarized light when suitably oriented or aligned. The present invention includes methods of patterning oriented or orientable materials to make polarized light emitting OEL devices and displays. The present invention also includes new polarized light emitting OEL devices and displays.

The ability for an OEL lamp or OEL display to emit polarized light can provide a number of benefits. For example, OEL displays that incorporate oriented light emitting materials can be combined with one or more polarizers or other optical elements that allow a substantial portion of polarized light emitted from the devices to be transmitted while blocking some portion of ambient light, thereby reducing glare and/or increasing display contrast. OEL lamps that emit polarized light can be used as backlights in liquid crystal displays, for example, thereby increasing brightness at lower power consumption. Conventional light sources emit unpolarized light, and there can be a significant loss of light using a polarization filter. Other advantages and benefits can also be provided by polarized light emitting OEL devices, whether used in direct view information displays, projector systems, backlights, monochromatic displays, color displays, full color displays, microdisplays, or other such applications.

In another embodiment, the present invention contemplates patterning oriented conducting or semiconducting polymers to form the charge conductive or semiconductive layers in organic electronic devices. Some electronically active polymers have been shown to exhibit enhanced electronic properties, such as improved charge mobility, when the electronically active polymer is oriented. Oriented electronically active polymers can also exhibit unique effects such as preferred charge mobility directions (e.g., charge mobility in the orientation direction enhanced relative to an orthogonal direction). The present invention provides the ability to pattern oriented electronically active polymers to make organic devices that have improved and/or unique functionality. In this way, unique or improved organic transistors, electrodes, light emitting devices, and the like can be made that incorporate oriented conductive or semi-conductive polymers patterned according to the present invention.

In this document, the term organic electroluminescent (OEL) display or device is used to broadly refer to electroluminescent displays or devices that include an organic emissive material, whether that emissive material includes a small molecule (SM) emitter, a light emitting polymer (LEP), a doped LEP, a blended LEP, an LEP or SM emitter disposed in a host matrix, or another organic emissive material whether provided alone or in combination with any other organic or inorganic materials that are functional or non-functional in the OEL display or devices.

The term polarized light is used to refer to light that is substantially polarized, for example having a polarization ratio of about 2:1 or greater, where polarization ratio is the ratio of the intensity of light having the polarization state of interest to the intensity of light having the orthogonal polarization state. Polarized light can be linearly polarized, circularly polarized, or elliptically polarized.

Light is referred to as unpolarized light if its constituent electric field vectors have no preferred orientation, i.e., the field vectors have nearly equal magnitudes in all directions perpendicular to the plane of polarization. Unpolarized light can be converted to linearly polarized light by directing it through a polarizing filter, which permits only those electric field vectors parallel to the transmission axis of the filter to be transmitted. Linearly polarized light can be converted into circularly polarized light (and vice versa) by use of a quarter wave plate.

The terms oriented and aligned are used interchangeably in this document to describe an organic electronically active layer or portion thereof whose constituent molecular units have a determinable preferred orientation, directionality, or alignment. The terms orientable and alignable refer to a layer or material that is capable of being oriented or aligned. The term alignment layer refers to a layer, coating, or film that can induce an orientation of an orientable material when the orientable material suitably contacts or is suitably contacted by the alignment layer.

In this document, the term emissive, or light emitting, refers to a material that emits light photons due to the interaction of the material with another energy source. The type of material, the nature of the energy source provoking the light emission, and the characteristics of the light emitted can be divided into separate classes, at least one of which is the dominant mechanism for light emission for a particular material in a particular device construction.

One class of emissive materials is referred to as photoluminescent (PL) materials, in which the material absorbs light photons of one frequency, and re-emits the light at a different frequency. One type of PL materials are fluorescent materials, which typically absorb photons of a high frequency, and rapidly re-emit the light at a lower frequency. Yet another type of PL materials is phosphorescent materials, which interact in a similar manner as fluorescent materials, however the rate of re-emission tends to be much slower leading to emission that lasts for a significant time after the exciting photons have ceased.

Another class of emissive material is referred to as electroluminescent (EL) materials, in which the interaction with electrical energy results in the emission of light photons. One type of EL materials are inorganic EL materials, in which an electron-hole pair induces the generation of an exciton in an inorganic molecule, which then emits a photon upon decay to a lower energy state.

Another type of EL material are OEL materials, which may be either small molecule (SM) or polymeric (LEP) in nature. Typically, SM materials are multi-ring organic or organo-metallic molecules having a high degree of unsaturation forming a conjugated system. In order to effectively utilize the emissive nature of these materials, a dense compacted layer of SM materials can be deposited onto an electrode using vapor deposition and the like. LEP materials are conjugated polymeric molecules having sufficient molecular weight so as to be film-forming. LEP materials are typically utilized by casting a solvent solution of the LEP material on a substrate, and evaporating the solvent, thereby leaving a polymeric film, although some LEP materials may be extrusion coated or coated by other means. Alternatively, the LEP can be formed in situ on a substrate by reaction of precursor species, for example when the LEP is not amenable to solvent coating. While OEL materials are generally characterized in this document as either SM or LEP, it will be recognized that some OEL materials may be difficult to classify in that they share characteristics of SM and LEP materials. To be inclusive, such materials are included in both the SM and LEP classifications for the purposes of this document.

Alignment of emissive materials into a preferred orientation can result in the emission of polarized light upon suitable excitation of these materials.

The terms active or electronically active, when used to refer to a layer or material in an organic electronic device, indicate layers or materials that perform a function during operation of the device, for example producing, conducting, or semiconducting a charge carrier (e.g., electrons or holes), producing light, enhancing or tuning the electronic properties of the device construction, and the like. The term non-active material refers to materials that, although not directly contributing to functions as described above, may have some non-direct contribution to the assembly or fabrication and/or to the functionality of an organic electronic device.

Figure 1A:
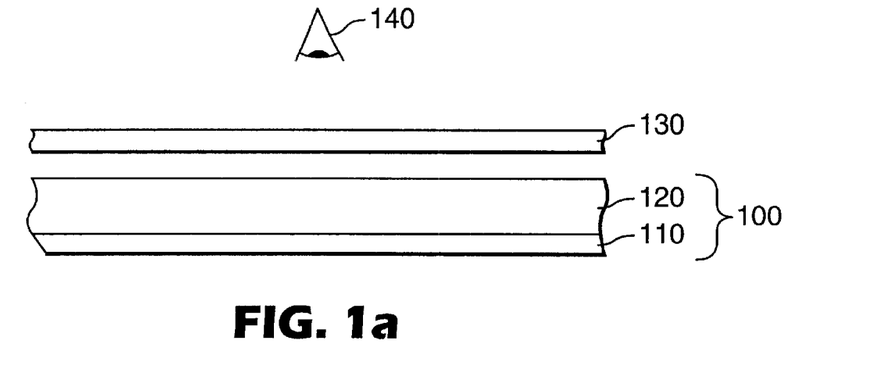
FIG. 1(a) is a schematic side view of an organic electroluminescent display construction.

FIG. 1(a) shows an OEL display or device 100 that includes a device layer 110 and a substrate 120. Any other suitable display component can also be included with display 100. Optionally, additional optical elements or other devices suitable for use with electronic displays, devices, or lamps can be provided between display 100 and viewer position 140 as indicated by optional element 130. In some embodiments like the one shown, device layer 110 includes one or more OEL devices that emit light through the substrate toward a viewer position 140. The viewer position 140 is used generically to indicate an intended destination for the emitted light whether it be an actual human observer, a screen, an optical component, an electronic device, or the like. In other embodiments (not shown), device layer 110 is positioned between substrate 120 and the viewer position 140. The device configuration shown in FIG. 1(a) (termed "bottom emitting") may be used when substrate 120 is transmissive to light emitted by device layer 110 and when a transparent conductive electrode is disposed in the device between the emissive layer of the device and the substrate. The inverted configuration (termed "top emitting") may be used when substrate 120 does or does not transmit the light emitted by the device layer and the electrode disposed between the substrate and the light emitting layer of the device does not transmit the light emitted by the device.

Device layer 110 can include one or more OEL devices arranged in any suitable manner. For example, in lamp applications (e.g., backlights for liquid crystal display (LCD) modules), device layer 110 might constitute a single OEL device that spans an entire intended backlight area. Alternatively, in other lamp applications, device layer 110 might constitute a plurality of closely spaced devices that can be contemporaneously activated. For example, relatively small and closely spaced red, green, and blue light emitters can be patterned between common electrodes so that device layer 110 appears to emit white light when the emitters are activated. Other arrangements for backlight applications are also contemplated. In direct view or other display applications, it may be desirable for device layer 110 to include a plurality of independently addressable OEL devices that emit the same or different colors. Each device might represent a separate pixel or a separate sub-pixel of a pixilated display (e.g., high resolution display), a separate segment or sub-segment of a segmented display (e.g., low information content display), or a separate icon, portion of an icon, or lamp for an icon (e.g., indicator applications). Various new OEL devices and displays that emit polarized light are described in more detail in discussions that follow.

In at least some instances, an OEL device includes a thin layer, or layers, of one or more suitable organic materials sandwiched between a cathode and an anode. When activated, electrons are injected into the organic layer(s) from the cathode and holes are injected into the organic layer(s) from the anode. As the injected charges migrate towards the oppositely charged electrodes, they may recombine to form electron-hole pairs which are typically referred to as excitons. These excitons, or excited state species, may emit energy in the form of light as they decay back to a ground state. Other layers can also be present in OEL devices such as hole transport layers, electron transport layers, hole injection layer, electron injection layers, hole blocking layers, electron blocking layers, buffer layers, and the like. In addition, photoluminescent materials can be present in the electroluminescent or other layers in OEL devices, for example to convert the color of light emitted by the electroluminescent material to another color. These and other such layers and materials can be used to alter or tune the electronic properties and behavior of the layered OEL device, for example to achieve a desired current/voltage response, a desired device efficiency, a desired color, a desired brightness, and the like.

Illustrative examples of OEL constructions include molecularly dispersed polymer devices where charge carrying and/or emitting species are dispersed in a polymer matrix, conjugated polymer devices where layers of polymers such as polyphenylene vinylene, polyfluorene, or others act as an emitting species and/or a charge carrying species, vapor deposited small molecule heterostructure devices, light emitting electrochemical cells, and vertically stacked organic light-emitting diodes capable of emitting light of multiple wavelengths. Other OEL devices include polymer-based emissive materials such as small molecule light emitters dispersed in a polymer matrix. For example, poly(9-vinylcarbazole), commonly known as PVK, PVCz, or polyvinylcarbazole, is frequently used as a polymeric matrix for dispersing small molecules for hybrid OEL devices. Other device constructions whether now known or later developed are contemplated for use in the present invention to make polarized light emitting OEL devices and displays.

The present invention contemplates OEL devices that include an oriented or aligned emissive material to thereby emit polarized light. The oriented emissive material can be included in the OEL layer of the device, or can be an oriented PL material such as an oriented fluorescent dye that emits polarized light when excited by photons emitted by the OEL material of the device, for example. According to the present invention, OEL displays and lamps can be made that include a plurality of independently addressable OEL devices, each of which emits substantially polarized light and where the polarization axis for light emitted from each device can be the same or different from the light emitted from other devices. Also according to the present invention, OEL displays and lamps can be made that include one or more OEL devices that contain a pre-oriented emissive material to emit polarized light, that is, devices that include an oriented emissive material but that do not include as part of the device the layer or material used to orient or align the emissive layer.

Referring back to FIG. 1(a), the present invention contemplates that device layer 110 includes an oriented light emissive material. As used herein, terms such as oriented light emissive material refer to organic emissive materials that are capable of being oriented or aligned so that they can emit substantially polarized light. Examples of such orientable or alignable organic light emitters include orientable or alignable LEPs, orientable or alignable SM emitters, and LEPs or SM emitters disposed in an orienting host matrix. Examples of orientable organic emissive materials are disclosed by Martin Grell and Donal D. C. Bradley, "Polarized Luminescence from Oriented Molecular Materials," *Adv. Mater.*, vol. 11, p. 895 (1999). Device layer 110 can alternatively or additionally contain an oriented conductive or semiconductive polymer, for example as a charge transport material or as an electrode or portion thereof. Examples of orientable conductive or semiconductive polymers are disclosed by A. Kambili and A. B. Walker, "Transport Properties of Highly Aligned Polymer Light-Emitting Diodes," *Phys. Rev. B.* vol. 63, p. 012201-1 (2000).

Examples of classes of LEP materials include poly (phenylenevinylene)s (PPVs), poly-para-phenylenes (PPPs), polyfluorenes (PFs), other LEP materials now known or later developed, and co-polymers and/or blends thereof. Suitable LEPs can also be molecularly doped, dispersed with fluorescent dyes or other PL materials, blended with active or non-active materials, dispersed with active or non-active materials, and the like. Orientable or alignable LEPs include standard LEPs (e.g., achiral compounds and racemic mixtures) that have a liquid crystal phase, chiral liquid crystal LEPs, and LEPs disposed in an orienting host matrix.

Examples of conducting or semiconducting polymers and organics include oligothiophenes, polythiophenes, polypyroles, polyanilines, LEPs, and other such materials and blends and co-polymers thereof. Orientable or alignable conducting or semiconducting polymers include those that have a liquid crystal phase, chiral liquid crystal conducting or semiconducting polymers, and conducting or semiconducting polymers disposed in an orienting host matrix.

SM materials are generally non-polymer organic or organometallic molecular materials that can be used in OEL displays and devices as emitter materials, charge transport materials, as dopants in emitter layers (e.g., to control the emitted color) or charge transport layers, and the like. Commonly used SM materials include metal chelate compounds, such as tris(8-hydroxyquinoline)aluminum (ALQ), and N,N'-bis(3-methylphenyl)-N,N'-diphenylbenzidine (TPD). Orientable or alignable SM materials include chiral SM materials and SM materials disposed in a orienting host matrix. See, for example, the SM materials disclosed in Japanese Laid Open Patent Application 2000-195673.

Polarized light emitting OEL devices can also include oriented PL materials such as fluorescent dyes disposed in an orienting matrix. PL materials (oriented or not) can be used in OEL devices and displays to change or tune the color of light emission. In the present invention, oriented PL materials can be used to emit polarized light, even in instances where the light produced by the electroluminescent material that stimulates the PL materials is unpolarized. Examples of organic PL materials include fluorescent dyes such as those disclosed in European Patent Application EP 1 074 600 A2. Orientable or alignable PL materials include those disclosed by Martin Grell and Donal D. C. Bradley, "Polarized Luminescence from Oriented Molecular Materials," Adv. Mater., vol. 11, p. 895 (1999) and by Christoph Weder et al., "Highly Polarized Luminescence from Oriented Conjugated Polymer/Polyethylene Blend Films," Adv. Mater., vol. 9, p. 1035 (1997).

Alignment, or orientation, of organic emissive and/or electronically active materials can be achieved in a variety of manners, and generally depends on the material being aligned, the desired device construction, and other such factors.

Light emitting and other electronically active polymers can be oriented in a number of ways, including: shear-orienting an orientable active polymer during solution coating or extrusion coating, including disposing an orientable active polymer in a host matrix and shear coating; coating an active LC polymer onto a suitable alignment layer; coating an active LC polymer onto a stretched, and hence anisotropically structured, film (or layered sheet); coating an active polymer onto a film (or layered sheet) and stretching the composite article; coating an active LC polymer onto a film (or layered sheet) and then brushing or rubbing the polymer coating; forming a conductive or semiconductive organic layer, such as an electronically active polymer, rubbing or brushing the layer to make an active alignment layer, and then coating an active LC polymer onto the active alignment layer. The term active LC polymer includes electronically active polymers that have a liquid crystal phase, inert or semiconducting polymers having a liquid crystal phase and that are doped with a polymeric or oligomeric electronically active species (e.g., a chromophore), and inert or semiconducting polymers having a liquid crystal phase that are doped with an electronically active SM material (e.g., a SM chromophore). The term active polymer includes those that do not have a liquid crystal phase as well as those that do. Some of these and other methods are described in Martin Grell and Donal D. C. Bradley, "Polarized Luminescence from Oriented Molecular Materials," Adv. Mater., vol. 11, p. 895 (1999); M. Jandke et al., "Polarized Electroluminescence from Rubbing-Aligned Poly(p-phenylenevinylene)," Adv. Mater., vol. 11, p. 1158 (1999); X. Linda Chen et al., "Polarized Electroluminescence from Aligned Chromophores by the Friction Transfer Method," Adv. Mater., vol. 12, p. 344 (2000); and M. Oda et al., "Circularly Polarized Electroluminescence from Liquid-Crystalline Chiral Polyfluorenes," Adv. Mater., vol. 12, p. 362 (2000).

SM emitters can be oriented in a number of ways, including: disposing an orientable SM emitter material in an orienting host matrix and shear coating, where the orienting host matrix can include electronically active materials, electronically inert materials, and/or light emitting materials; vapor depositing a chiral SM material on a suitable substrate; vapor depositing onto an anisotropic substrate that can induce oriented growth of a SM coating; and any other suitable method. Some of these and other methods are described in Japanese Laid-Open Patent Application 2000-195673.

PL materials such as fluorescent dyes can be oriented in a number of ways, including disposing an orientable PL material in an orienting host matrix and shear coating, where the orienting host matrix can include electronically active materials, electronically inert materials, and/or light emitting materials. See methods disclosed in, for example, co-assigned U.S. patent application Ser. No. 09/426,288, and in C. Kocher et al., "Patterning of Oriented Photofunctional Polymer Systems Through Selective Photobleaching," Adv. Funct. Mater., vol. 11, p. 31 (2001) and Martin Grell and Donal D. C. Bradley, "Polarized Luminescence from Oriented Molecular Materials," Adv. Mater., vol. 11, p. 895 (1999).

Referring back to FIG. 1(a), device layer 110 is disposed on substrate 120. Substrate 120 can be any substrate suitable for OEL device and display applications. For example, substrate 120 can comprise glass, clear plastic, or other suitable material(s) that are substantially transparent to visible light. Substrate 120 can also be opaque to visible light, for example stainless steel, crystalline silicon, poly-silicon, or the like. Because some materials in OEL devices can be particularly susceptible to damage due to exposure to oxygen and/or water, substrate 120 preferably provides an adequate environmental barrier, or is supplied with one or more layers, coatings, or laminates that provide an adequate environmental barrier.

Substrate 120 can also include any number of devices or components suitable in OEL devices and displays such as transistor arrays and other electronic devices; color filters, polarizers, wave plates, diffusers, and other optical devices; insulators, barrier ribs, black matrix, mask work and other such components; and the like. Generally, one or more electrodes will be coated, deposited, patterned, or otherwise disposed on substrate 120 before forming the remaining layer or layers of the OEL device or devices of the device layer 110. When a light transmissive substrate 120 is used and the OEL device or devices are bottom emitting, the electrode or electrodes that are disposed between the substrate 120 and the emissive material(s) are preferably substantially transparent to light, for example transparent conductive electrodes such as indium tin oxide (ITO) or any of a number of other transparent conductive oxides.

Element 130 can be any element or combination of elements suitable for use with OEL display or device 100. For example, element 130 can be an LCD module when device 100 is a backlight. One or more polarizers or other elements can be provided between the LCD module and the backlight device 100, for instance an absorbing or reflective clean-up polarizer. Alternatively, when device 100 is itself an information display, element 130 can include one or more of polarizers, wave plates, touch panels, antireflective coatings, anti-smudge coatings, projection screens, brightness enhancement films, or other optical components, coatings, user interface devices, or the like.

In exemplary applications, element 130 includes a polarizer whose transmission axis is positioned to allow polarized light from one or more of the devices of device layer 110 to be transmitted, preferably substantially transmitted. By including a polarizer in front of the display 100, a significant proportion of the ambient light and undesired reflected light can be blocked, thereby reducing glare and increasing contrast, while at the same time allowing polarized light from the polarized light emitting devices to be transmitted. For example, a dichroic linear polarizer can be placed in front of the display and positioned with its transmission axis aligned with the polarization axis of the emitted polarized light. In essence, the polarizer can act as a one-way neutral density filter in that it can absorb about half of the ambient light while allowing substantially all emitted light through in some embodiments. When achieving a high degree of polarization of light emitted by the OEL lamp or display is important, a polarizer can also be used as a "clean-up polarizer" to increase the polarization ratio by blocking (by reflection or absorption) a substantial portion of the light that does not have the desired polarization state.

Figure 1B:
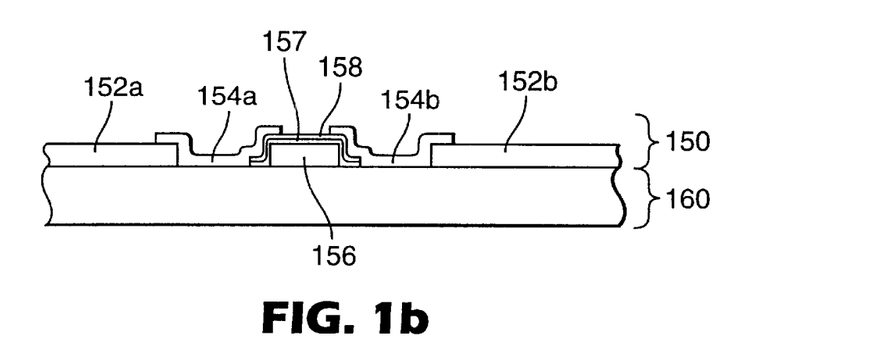
FIG. 1(b) is a schematic side view of an organic transistor construction.

FIG. 1(*b*) shows an organic transistor 150 disposed on a substrate 160. The organic transistor includes a source 152*a* and a drain 152*b*, a gate electrode 156, an insulting dielectric layer 157, a semiconductor layer 158, a source contact 154*a* that connects source 152*a* to semiconductor 158, and a drain contact 154*b* that connects drain 152*b* to semiconductor 158. Any one or more of the conductive or semiconductive elements of transistor 150 can include an organic electronically active material. Further, any of the organic electronically active materials can include an oriented material, which in turn can be patterned according to methods of the present invention. The particular construction of transistor 150 is shown for illustrative purposes, and any suitable transistor construction can be used. Substrate 160 can be any material suitable for use as an organic electronic device substrate or display substrate.

Organic electronic devices containing oriented materials for polarized light emission or for enhanced electronic properties can be made at least in part by selective thermal transfer of oriented or orientable material from a thermal transfer donor sheet to a desired receptor substrate. For example, polarized light emitting polymer displays and lamps can be made by suitably orienting an LEP on a donor sheet and then selectively transferring the oriented LEP layer alone or along with other device layers or materials to the display substrate. Selective thermal transfer of the oriented material can be performed while substantially maintaining the orientation of the transfer material. Any of the alignment and orientation methods disclosed above can be used to form an oriented emissive layer (or other oriented electronically active layer) on the transfer sheet. Alternatively, an oriented or microstructured functional alignment layer, such as a microstructured hole transport layer, can be formed on the display substrate, via thermal transfer of an oriented functional alignment layer from a donor sheet or otherwise, followed by coating or selectively thermally transferring an orientable LEP (or other orientable emissive or electronically active material) onto the functional alignment layer. By forming a functional alignment layer, the emissive material need not be transferred in an oriented state, and may be coated by more conventional means. The act of thermal transfer can heat the orientable material sufficiently to allow it to become oriented when transferred to the functional alignment layer. Alternatively, orientable materials disposed on functional alignment layers (via selective thermal transfer or more conventional means) can be post-oriented by an annealing procedure. In another embodiment, an oriented conductive or semiconductive polymer can be patterned on a device substrate via selective thermal transfer from a donor to form one or more layers of an organic transistor, to form electrodes or charge transport layers for OEL devices, or the like.

When an oriented material is being transferred from a donor sheet, it may be preferred that layers of the transfer sheet that may have been utilized for aligning or orienting transfer layer material(s) are not themselves transferred if such alignment layers would undesirably diminish device functionality, and may or may not be transferred along with the oriented transfer layer material(s) if they are capable of providing or enhancing device functionality. The ability to selectively transfer oriented material from a donor sheet with or without also transferring an alignment layer allows greater flexibility in choosing alignment layers and orientation methods.

Figure 2:
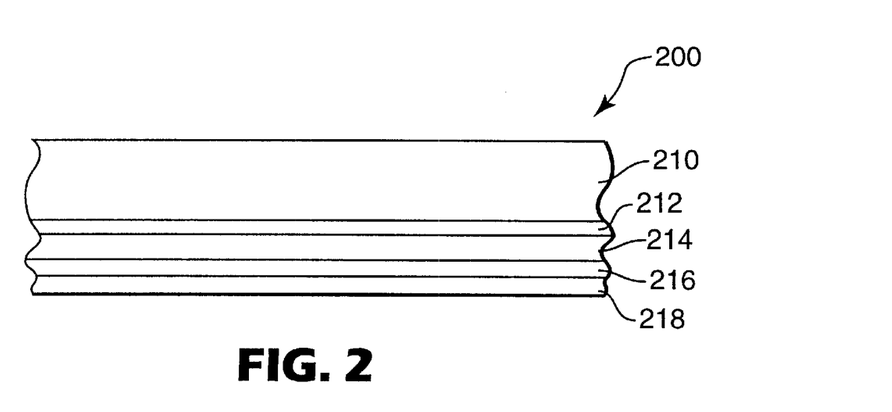
FIG. 2 is a schematic side view of a thermal transfer donor element for transferring materials according to the present invention.

Selective thermal transfer of layers containing oriented or orientable active materials for organic electronic devices can be performed using a thermal transfer donor. FIG. 2 shows an example of a thermal transfer donor 200 suitable for use in the present invention. Donor element 200 includes a base substrate 210, an optional underlayer 212, an optional light-to-heat conversion layer (LTHC layer) 214, an optional interlayer 216, and a transfer layer 218 that comprises an oriented or orientable emissive material or functional alignment layer. Each of these elements are described in more detail in the discussion that follows. Other layers can also be present. Exemplary donors are disclosed in U.S. Pat. Nos. 6,194,119; 6,114,088; 5,998,085; 5,725,989; 5,710,097; 5,695,907; and 5,693,446, and in co-assigned U.S. patent application Ser. Nos. 09/662,980; 09/563,597; 09/474,002; 09/473,114; and 09/451,984.

In processes of the present invention, oriented (or orientable) electronically active and/or emissive organic materials, including oriented LEPs and conductive or semiconductive polymers, can be selectively transferred from the transfer layer of a thermal mass transfer donor element to a receptor substrate by placing the transfer layer of the donor element adjacent to the receptor and selectively heating the donor element. Illustratively, the donor element can be selectively heated by irradiating the donor element with imaging radiation that can be absorbed by light-to-heat converter material disposed in the donor, often in a separate LTHC layer, and converted into heat. In these cases, the donor can be exposed to imaging radiation through the donor substrate, through the receptor, or both. The radiation can include one or more wavelengths, including visible light, infrared radiation, or ultraviolet radiation, for example from a laser, lamp, or other such radiation source. Other selective heating methods can also be used, such as using a thermal print head or using a thermal hot stamp (e.g., a patterned thermal hot stamp such as a heated silicone stamp that has a relief pattern that can be used to selectively heat a donor). Material from the thermal transfer layer can be selectively transferred to a receptor in this manner to imagewise form patterns of the transferred material on the receptor. In many instances, thermal transfer using light from, for example, a lamp or laser, to patternwise expose the donor can be advantageous because of the accuracy and precision that can often be achieved. The size and shape of the transferred pattern (e.g., a line, circle, square, or other shape) can be controlled by, for example, selecting the size of the light beam, the exposure pattern of the light beam, the duration of directed beam contact with the thermal mass transfer element, and/or the materials of the thermal mass transfer element. The transferred pattern can also be controlled by irradiating the donor element through a mask.

As mentioned, a thermal print head or other heating element (patterned or otherwise) can also be used to selectively heat the donor element directly, thereby pattern-wise transferring portions of the transfer layer. In such cases, the light-to-heat converter material in the donor sheet is optional. Thermal print heads or other heating elements may be particularly suited for making lower resolution patterns of material or for patterning elements whose placement need not be precisely controlled.

Transfer layers can also be transferred from donor sheets without selectively transferring the transfer layer. For example, a transfer layer can be formed on a donor substrate that, in essence, acts as a temporary liner that can be released after the transfer layer is contacted to a receptor substrate, typically with the application of heat and/or pressure. Such a method, referred to as lamination transfer, can be used to transfer the entire transfer layer, or a large portion thereof, to the receptor.

The mode of thermal mass transfer can vary depending on the type of selective heating employed, the type of irradiation if used to expose the donor, the type of materials and properties of the optional LTHC layer, the type of materials in the transfer layer, the overall construction of the donor, the type of receptor substrate, and the like. Without wishing to be bound by any theory, transfer generally occurs via one or more mechanisms, one or more of which may be emphasized or de-emphasized during selective transfer depending on imaging conditions, donor constructions, and so forth. One mechanism of thermal transfer includes thermal melt-stick transfer whereby localized heating at the interface between the thermal transfer layer and the rest of the donor element can lower the adhesion of the thermal transfer layer to the donor in selected locations. Selected portions of the thermal transfer layer can adhere to the receptor more strongly than to the donor so that when the donor element is removed, the selected portions of the transfer layer remain on the receptor. Another mechanism of thermal transfer includes ablative transfer whereby localized heating can be used to ablate portions of the transfer layer off of the donor element, thereby directing ablated material toward the receptor. Yet another mechanism of thermal transfer includes sublimation whereby material dispersed in the transfer layer can be sublimated by heat generated in the donor element. A portion of the sublimated material can condense on the receptor. The present invention contemplates transfer modes that include one or more of these and other mechanisms whereby selective heating of a thermal mass transfer donor element can be used to cause the transfer of materials from a transfer layer to receptor surface.

A variety of radiation-emitting sources can be used to heat thermal mass transfer donor elements. For analog techniques (e.g., exposure through a mask), high-powered light sources (e.g., xenon flash lamps and lasers) are useful. For digital imaging techniques, infrared, visible, and ultraviolet lasers are particularly useful. Suitable lasers include, for example, high power ($\geq 100$ mW) single mode laser diodes, fiber-coupled laser diodes, and diode-pumped solid state lasers (e.g., Nd:YAG and Nd:YLF). Laser exposure dwell times can vary widely from, for example, a few hundredths of microseconds to tens of microseconds or more, and laser fluences can be in the range from, for example, about 0.01 to about 5 J/cm$^2$ or more. Other radiation sources and irradiation conditions can be suitable based on, among other things, the donor element construction, the transfer layer material, the mode of thermal mass transfer, and other such factors.

When high spot placement accuracy is desired (e.g., when patterning elements for high information content displays and other such applications) over large substrate areas, a laser can be particularly useful as the radiation source. Laser sources are also compatible with both large rigid substrates (e.g., 1 m×1 m×1.1 mm glass) and continuous or sheeted film substrates (e.g., 100 µm thick polyimide sheets).

During imaging, the thermal mass transfer element can be brought into intimate contact with a receptor (as might typically be the case for thermal melt-stick transfer mechanisms) or the thermal mass transfer element can be spaced some distance from the receptor (as can be the case for ablative transfer mechanisms or material sublimation transfer mechanisms). In at least some instances, pressure or vacuum can be used to hold the thermal transfer element in intimate contact with the receptor. In some instances, a mask can be placed between the thermal transfer element and the receptor. Such a mask can be removable or can remain on the receptor after transfer. If a light-to-heat converter material is present in the donor, radiation source can then be used to heat the LTHC layer (and/or other layer(s) containing radiation absorber) in an imagewise fashion (e.g., digitally or by analog exposure through a mask) to perform imagewise transfer and/or patterning of the transfer layer from the thermal transfer element to the receptor.

Typically, selected portions of the transfer layer are transferred to the receptor without transferring significant portions of the other layers of the thermal mass transfer element, such as the optional interlayer or LTHC layer. The presence of the optional interlayer may eliminate or reduce the transfer of material from an LTHC layer to the receptor and/or reduce distortion in the transferred portion of the transfer layer. Preferably, under imaging conditions, the adhesion of the optional interlayer to the LTHC layer is greater than the adhesion of the interlayer to the transfer layer. The interlayer can be transmissive, reflective, and/or absorptive to imaging radiation, and can be used to attenuate or otherwise control the level of imaging radiation transmitted through the donor and/or to manage temperatures in the donor, for example to reduce thermal or radiation-based damage to the transfer layer during imaging. Multiple interlayers can be present.

Large thermal transfer elements can be used, including thermal transfer elements that have length and width dimensions of a meter or more. In operation, a laser can be rastered or otherwise moved across the large thermal transfer element, the laser being selectively operated to illuminate portions of the thermal transfer element according to a desired pattern. Alternatively, the laser may be stationary and the thermal transfer element and/or receptor substrate moved beneath the laser.

In some instances, it may be necessary, desirable, and/or convenient to sequentially use two or more different thermal transfer elements to form electronic devices on a receptor. For example, multiple layer devices can be formed by transferring separate layers or separate stacks of layers from different thermal transfer elements. Multilayer stacks can also be transferred as a single transfer unit from a single donor element. For example, a hole transport layer and an oriented LEP layer can be co-transferred from a single donor. As another example, an oriented semiconductive polymer and an emissive layer (oriented or not) can be co-transferred from a single donor. Multiple donor sheets can also be used to form separate components in the same layer on the receptor. For example, three different donors that each have a transfer layer comprising an oriented LEP capable of emitting a different color (for example, red, green, and blue) can be used to form RGB sub-pixel OEL devices for a full color polarized light emitting electronic display. As another example, an oriented conductive or semiconductive polymer can be patterned via thermal transfer from one donor, followed by selective thermal transfer of emissive layers from one or more other donors to form a plurality of OEL devices in a display. As still another example, layers for organic transistors can be patterned by selective thermal transfer of electronically active organic materials (oriented or not), followed by selective thermal transfer patterning of one or more pixel or sub-pixel elements such as color filters, emissive layers, active alignment layers, charge transport layers, electrode layers, and the like.

Materials from separate donor sheets can be transferred adjacent to other materials on a receptor to form adjacent devices, portions of adjacent devices, or different portions of the same device. Alternatively, materials from separate donor sheets can be transferred directly on top of, or in partial overlying registration with, other layers or materials previously patterned onto the receptor by thermal transfer or some other method (e.g., photolithography, deposition through a shadow mask, etc.). A variety of other combinations of two or more thermal transfer elements can be used to form a device, each thermal transfer element forming one or more portions of the device. It will be understood that other portions of these devices, or other devices on the receptor, may be formed in whole or in part by any suitable process including photolithographic processes, ink jet processes, and various other printing or mask-based processes, whether conventionally used or newly developed.

Referring back to FIG. 2, various layers of the thermal mass transfer donor element 200 will now be described.

The donor substrate 210 can be a polymer film. One suitable type of polymer film is a polyester film, for example, polyethylene terephthalate (PET) or polyethylene naphthalate (PEN) films. However, other films with sufficient optical properties, including high transmission of light at a particular wavelength, and/or sufficient mechanical and thermal stability properties, depending on the particular application, can be used. The donor substrate, in at least some instances, is flat so that uniform coatings can be formed thereon. The donor substrate is also typically selected from materials that remain stable despite heating of one or more layers of the donor. However, as described below, the inclusion of an underlayer between the substrate and an LTHC layer can be used to insulate the substrate from heat generated in the LTHC layer during imaging. The typical thickness of the donor substrate ranges from 0.025 to 0.15 mm, preferably 0.05 to 0.1 mm, although thicker or thinner donor substrates may be used.

The materials used to form the donor substrate and an optional adjacent underlayer can be selected to improve adhesion between the donor substrate and the underlayer, to control heat transport between the substrate and the underlayer, to control imaging radiation transport to the LTHC layer, to reduce imaging defects and the like. An optional priming layer can be used to increase uniformity during the coating of subsequent layers onto the substrate and also increase the bonding strength between the donor substrate and adjacent layers.

An optional underlayer 212 may be coated or otherwise disposed between a donor substrate and the LTHC layer, for example to control heat flow between the substrate and the LTHC layer during imaging and/or to provide mechanical stability to the donor element for storage, handling, donor processing, and/or imaging. Examples of suitable underlayers and methods of providing underlayers are disclosed in coassigned U.S. patent application Ser. No. 09/743,114.

The underlayer can include materials that impart desired mechanical and/or thermal properties to the donor element. For example, the underlayer can include materials that exhibit a low specific heat×density and/or low thermal conductivity relative to the donor substrate. Such an underlayer may be used to increase heat flow to the transfer layer, for example to improve the imaging sensitivity of the donor.

The underlayer may also include materials for their mechanical properties or for adhesion between the substrate and the LTHC. Using an underlayer that improves adhesion between the substrate and the LTHC layer may result in less distortion in the transferred image. As an example, in some cases an underlayer can be used that reduces or eliminates delamination or separation of the LTHC layer, for example, that might otherwise occur during imaging of the donor media. This can reduce the amount of physical distortion exhibited by transferred portions of the transfer layer. In other cases, however it may be desirable to employ underlayers that promote at least some degree of separation between or among layers during imaging, for example to produce an air gap between layers during imaging that can provide a thermal insulating function. Separation during imaging may also provide a channel for the release of gases that may be generated by heating of the LTHC layer during imaging. Providing such a channel may lead to fewer imaging defects.

The underlayer may be substantially transparent at the imaging wavelength, or may also be at least partially absorptive or reflective of imaging radiation. Attenuation and/or reflection of imaging radiation by the underlayer may be used to control heat generation during imaging.

Referring again to FIG. 2, an LTHC layer 214 can be included in thermal mass transfer elements of the present invention to couple irradiation energy into the thermal transfer element. The LTHC layer preferably includes a radiation absorber that absorbs incident radiation (e.g., laser light) and converts at least a portion of the incident radiation into heat to enable transfer of the transfer layer from the thermal transfer element to the receptor.

Generally, the radiation absorber(s) in the LTHC layer absorb light in the infrared, visible, and/or ultraviolet regions of the electromagnetic spectrum and convert the absorbed radiation into heat. The radiation absorber materials are typically highly absorptive of the selected imaging radiation, providing an LTHC layer with an optical density at the wavelength of the imaging radiation in the range of about 0.2 to 3 or higher. Optical density of a layer is the absolute value of the logarithm (base 10) of the ratio of the intensity of light transmitted through the layer to the intensity of light incident on the layer.

Radiation absorber material can be uniformly disposed throughout the LTHC layer or can be non-homogeneously distributed. For example, as described in co-assigned U.S. patent application Ser. No. 09/474,002, non-homogeneous LTHC layers can be used to control temperature profiles in donor elements. This can give rise to thermal transfer elements that have improved transfer properties (e.g., better fidelity between the intended transfer patterns and actual transfer patterns).

Suitable radiation absorbing materials can include, for example, dyes (e.g., visible dyes, ultraviolet dyes, infrared dyes, fluorescent dyes, and radiation-polarizing dyes), pigments, metals, metal compounds, metal films, and other suitable absorbing materials. Examples of suitable radiation absorbers includes carbon black, metal oxides, and metal sulfides. One example of a suitable LTHC layer can include a pigment, such as carbon black, and a binder, such as an organic polymer. Another suitable LTHC layer includes metal or metal/metal oxide formed as a thin film, for example, black aluminum (i.e., a partially oxidized aluminum having a black visual appearance). Metallic and metal compound films may be formed by techniques, such as, for example, sputtering and evaporative deposition. Particulate coatings may be formed using a binder and any suitable dry or wet coating techniques. LTHC layers can also be formed by combining two or more LTHC layers containing similar or dissimilar materials. For example, an LTHC layer can be formed by vapor depositing a thin layer of black aluminum over a coating that contains carbon black disposed in a binder.

Dyes suitable for use as radiation absorbers in a LTHC layer may be present in particulate form, dissolved in a binder material, or at least partially dispersed in a binder material. When dispersed particulate radiation absorbers are used, the particle size can be, at least in some instances, about 10 μm or less, and may be about 1 μm or less. Suitable dyes include those dyes that absorb in the IR region of the spectrum. A specific dye may be chosen based on factors such as, solubility in, and compatibility with, a specific binder and/or coating solvent, as well as the wavelength range of absorption.

Pigmentary materials may also be used in the LTHC layer as radiation absorbers. Examples of suitable pigments include carbon black and graphite, as well as phthalocyanines, nickel dithiolenes, and other pigments described in U.S. Pat. Nos. 5,166,024 and 5,351,617. Additionally, black azo pigments based on copper or chromium complexes of, for example, pyrazolone yellow, dianisidine red, and nickel azo yellow can be useful. Inorganic pigments can also be used, including, for example, oxides and sulfides of metals such as aluminum, bismuth, tin, indium, zinc, titanium, chromium, molybdenum, tungsten, cobalt, iridium, nickel, palladium, platinum, copper, silver, gold, zirconium, iron, lead, and tellurium. Metal borides, carbides, nitrides, carbonitrides, bronze-structured oxides, and oxides structurally related to the bronze family (e.g., $WO_{2.9}$) may also be used.

Metal radiation absorbers may be used, either in the form of particles, as described for instance in U.S. Pat. No. 4,252,671, or as films, as disclosed in U.S. Pat. No. 5,256,506. Suitable metals include, for example, aluminum, bismuth, tin, indium, tellurium and zinc.

Suitable binders for use in the LTHC layer include film-forming polymers, such as, for example, phenolic resins (e.g., novolak and resole resins), polyvinyl butyral resins, polyvinyl acetates, polyvinyl acetals, polyvinylidene chlorides, polyacrylates, cellulosic ethers and esters, nitrocelluloses, and polycarbonates. Suitable binders may include monomers, oligomers, or polymers that have been, or can be, polymerized or crosslinked. Additives such as photoinitiators may also be included to facilitate crosslinking of the LTHC binder. In some embodiments, the binder is primarily formed using a coating of crosslinkable monomers and/or oligomers with optional polymer.

The inclusion of a thermoplastic resin (e.g., polymer) may improve, in at least some instances, the performance (e.g., transfer properties and/or coatability) of the LTHC layer. It is thought that a thermoplastic resin may improve the adhesion of the LTHC layer to the donor substrate. In one embodiment, the binder includes 25 to 50 wt. % (excluding the solvent when calculating weight percent) thermoplastic resin, and, preferably, 30 to 45 wt. % thermoplastic resin, although lower amounts of thermoplastic resin may be used (e.g., 1 to 15 wt. %). The thermoplastic resin is typically chosen to be compatible (i.e., form a one-phase combination) with the other materials of the binder. In at least some embodiments, a thermoplastic resin that has a solubility parameter in the range of 9 to 13 $(cal/cm^3)^{1/2}$, preferably, 9.5 to 12 $(cal/cm^3)^{1/2}$, is chosen for the binder. Examples of suitable thermoplastic resins include polyacrylics, styrene-acrylic polymers and resins, and polyvinyl butyral.

Conventional coating aids, such as surfactants and dispersing agents, may be added to facilitate the coating process. The LTHC layer may be coated onto the donor substrate using a variety of coating methods known in the art. A polymeric or organic LTHC layer can be coated, in at least some instances, to a thickness of 0.05 μm to 20 μm, preferably, 0.5 μm to 10 μm, and, more preferably, 1 μm to 7 μm. An inorganic LTHC layer can be coated, in at least some instances, to a thickness in the range of 0.0005 to 10 μm, and preferably, 0.001 to 1 μm.

Referring again to FIG. 2, an optional interlayer 216 may be disposed between the LTHC layer 214 and transfer layer 218. The interlayer can be used, for example, to minimize damage and contamination of the transferred portion of the transfer layer and may also reduce distortion in the transferred portion of the transfer layer. The interlayer may also influence the adhesion of the transfer layer to the rest of the thermal transfer donor element. Typically, the interlayer has high thermal resistance. Preferably, the interlayer does not distort or chemically decompose under the imaging conditions, particularly to an extent that renders the transferred image non-functional. The interlayer typically remains in contact with the LTHC layer during the transfer process and is not substantially transferred with the transfer layer.

Suitable interlayers include, for example, polymer films, metal layers (e.g., vapor deposited metal layers), inorganic layers (e.g., sol-gel deposited layers and vapor deposited layers of inorganic oxides (e.g., silica, titania, and other metal oxides)), and organic/inorganic composite layers. Organic materials suitable as interlayer materials include both thermoset and thermoplastic materials. Suitable thermoset materials include resins that may be crosslinked by heat, radiation, or chemical treatment including, but not limited to, crosslinked or crosslinkable polyacrylates, polymethacrylates, polyesters, epoxies, and polyurethanes. The thermoset materials may be coated onto the LTHC layer as, for example, thermoplastic precursors and subsequently crosslinked to form a crosslinked interlayer.

Suitable thermoplastic materials include, for example, polyacrylates, polymethacrylates, polystyrenes, polyurethanes, polysulfones, polyesters, and polyimides. These thermoplastic organic materials may be applied via conventional coating techniques (for example, solvent coating, spray coating, or extrusion coating). Typically, the glass transition temperature ($T_g$) of thermoplastic materials suitable for use in the interlayer is 25° C. or greater, preferably 50° C. or greater. In some embodiments, the interlayer includes a thermoplastic material that has a $T_g$ greater than any temperature attained in the transfer layer during imaging. The interlayer may be either transmissive, absorbing, reflective, or some combination thereof, at the imaging radiation wavelength.

Inorganic materials suitable as interlayer materials include, for example, metals, metal oxides, metal sulfides, and inorganic carbon coatings, including those materials that are highly transmissive or reflective at the imaging light wavelength. These materials may be applied to the light-to-heat-conversion layer via conventional techniques (e.g., vacuum sputtering, vacuum evaporation, or plasma jet deposition).

The interlayer may provide a number of benefits. The interlayer may be a barrier against the transfer of material from the light-to-heat conversion layer. It may also modulate the temperature attained in the transfer layer so that thermally unstable materials can be transferred. For example, the interlayer can act as a thermal diffuser to control the temperature at the interface between the interlayer and the transfer layer relative to the temperature attained in the LTHC layer. This may improve the quality (i.e., surface roughness, edge roughness, etc.) of the transferred layer. The presence of an interlayer may also result in improved plastic memory in the transferred material.

The interlayer may contain additives, including, for example, photoinitiators, surfactants, pigments, plasticizers, and coating aids. The thickness of the interlayer may depend on factors such as, for example, the material of the interlayer, the material and properties of the LTHC layer, the material and properties of the transfer layer, the wavelength of the imaging radiation, and the duration of exposure of the thermal transfer element to imaging radiation. For polymer interlayers, the thickness of the interlayer typically is in the range of 0.05 μm to 10 μm. For inorganic interlayers (e.g., metal or metal compound interlayers), the thickness of the interlayer typically is in the range of 0.005 μm to 10 μm.

The interlayer (or other suitable donor layer contacting the orientable material of the transfer layer) can also serve as an alignment layer for orienting or aligning transfer layer material when oriented materials are to be transferred. For example, the interlayer or the LTHC can comprise a polymeric material that can be mechanically altered, e.g. by rubbing with a cloth, to form a microscopic alignment structure. This method is similar to the manner in which a polyimide layer is rubbed by a felt cloth to provide an alignment structure in LCDs. Although polyimide is the exemplary material used in the production of the alignment layer in LCDs, the primary reasons for using polyimide in LCDs include the innate resistance of polyimides to the common liquid crystalline materials and the high thermal stability of polimides, which can be helpful during processing of transparent conductive coatings. In the present invention, alignment layer materials can include any material that can serve as an alignment layer and that is compatible with the transfer layer material to be aligned.

An exemplary alignment interlayer includes a material that can be solution coated onto the donor, for example onto the LTHC layer or as a coating on an existing interlayer, and then brushed to create an alignment layer or coating. For example, solvent soluble polyimides such as those disclosed by M. Nishikawa, *Polym. Adv. Technol.*, vol. 11, p. 404 (2000) can be coated, dried, and brushed to form an alignment interlayer or an alignment coating on an existing interlayer.

Another method of forming an alignment layer is by imparting the layer with a microstructure, for example by embossing the layer against a microstructured tool. In this method, a thermoplastic LTHC or interlayer can be brought into contact with a microstructured tool under heat and/or pressure, and upon separation of the thermoplastic and the tool, the microstructure is imparted to the thermoplastic. Alternatively, a curable alignment layer material can be disposed between a microstructured tool and the appropriate layer of the donor sheet, and then cured to form a microstructured interlayer or LTHC layer.

Another method that can be used is one that can impart an alignment structure to a coating disposed on the interlayer. A class of materials commonly referred to as lyotropic materials exhibit the property of aligning themselves under shear to create a microstructure capable of providing an alignment layer or matrix for liquid crystals, dyes, polymers and the like. Some coating materials can be oriented by use of a coating method that produces a shear field in the coated liquid layer. Upon drying, the coating can be a suitable alignment layer. Many coating methods, such as knife coating, mayer rod coating, and certain types of roll or gravure coating, can produce alignment layers using suitable coating materials. One general class of coating materials that are orientable in this manner includes lyotropic liquid crystal materials, especially those that form nematic structures.

Referring again to FIG. 2, a thermal transfer layer 218 is included in thermal mass transfer donor element 200. Transfer layer 218 can include any suitable material or materials, disposed in one or more layers, alone or in combination with other materials. Transfer layer 218 is capable of being selectively transferred as a unit or in portions by any suitable transfer mechanism when the donor element is exposed to direct heating or to imaging radiation that can be absorbed by light-to-heat converter material and converted into heat.

The present invention contemplates a transfer layer that includes an oriented or orientable electronically active organic material, namely an oriented or orientable organic emissive material and/or conductive or semiconductive polymer. Oriented transfer layers can be provided in various ways, some of which are described in the discussion that follows to illustrate how specific orientable transfer layer materials might be oriented.

The present invention contemplates a transfer layer that includes an oriented LEP. One way of providing an oriented LEP transfer layer is by coating an orientable LEP onto an alignment layer of the donor, such as the alignment interlayers or LTHC layers described above. In this method, the orientable LEP can be solubilized by addition of a suitable compatible solvent, and coated onto the alignment layer by spin-coating, gravure coating, mayer rod coating, knife coating and the like. The solvent chosen preferably does not undesirably interact with (e.g., swell or dissolve) any of the already existing layers in the donor sheet. The coating can then be annealed and the solvent evaporated to leave a transfer layer oriented by the alignment structure.

Another method for providing an oriented LEP transfer layer is to coat the orientable LEP onto an active alignment layer that is also part of the transfer layer. An active alignment layer is a layer that can be transferred along with the oriented layer during the thermal transfer process, and becomes an integral part of the finished device. For example, an active alignment layer may be comprised of a hole transport layer, a layer having fluorescent and/or phosphorescent moieties disposed therein, a retarder layer, a layer having a high level of birefringence, a polarizing layer, or any other layer which may impart some electronic or optical characteristic to the finished device. In this method, the orientable transfer layer material can be solubilized by addition of a suitable compatible solvent, and coated onto the alignment layer by spin-coating, gravure coating, mayer rod coating, knife coating and the like. The solvent chosen preferably does not undesirably interact with (e.g., swell or dissolve) any of the already existing layers in the donor sheet. The solvent can then be evaporated from the coating to leave a multilayer transfer layer that includes an active alignment layer and on organic emissive or electronically active material oriented by the active alignment layer.

Yet another method for providing an oriented LEP transfer layer is to coat an orientable LEP onto a donor sheet and to stretch the resulting transfer sheet in an orientation direction. In this method, the orientable LEP can be solubilized by addition of a suitable compatible solvent, and coated onto the donor sheet by spin-coating, gravure coating, mayer rod coating, knife coating and the like. The solvent chosen preferably does not undesirably interact with (e.g., swell or dissolve) any of the already existing layers in the donor sheet. The solvent can then be evaporated from the coating to make a fully formed donor sheet. The donor sheet can then be stretched or tentered in a selected direction to align the molecules of the orientable material of the transfer layer. This method may be particularly suited to lamination transfer methods where an orientable transfer layer is coated onto a donor substrate, the composite article is stretched or tentered to orient the orientable transfer layer, and the transfer layer is transferred in its oriented state to a receptor by applying heat and/or pressure. In this way, the entire transfer layer, or large portion thereof, can be transferred in one exposure.

Still another method for providing an oriented LEP transfer layer is to form the transfer layer on the donor and then mechanically rub the LEP layer with a cloth, felt, or brushes, in a particular direction to impart an orientation to the layer. In this manner, a surface structure is imparted directly to the rubbed transfer layer material. Polarized light emission has been shown for rubbed LEP materials.

Still another method for providing an oriented LEP transfer layer is to dispose an orientable LEP material in an orienting matrix. In an exemplary embodiment, lyotropic liquid crystal materials that are shear coated as discussed above can be used as orienting matrices for LEPs, as well as for fluorescent dyes and other PL materials, SM materials, conductive and semiconductive polymers, and the like. The orientable material can be oriented by preparing a liquid solution of the orientable material in the host matrix material, shear coating the solution onto the donor, and drying the solution to produce a transfer layer that includes the orientable material oriented in the matrix.

Another technique is to coat an orientable LEP transfer layer on the donor and then selectively thermal transfer the orientable LEP onto an active alignment layer. For example, a charge transport material such as PEDOT can be disposed on a suitable display substrate and brushed or rubbed to form an alignment layer. Next, an orientable LEP transfer layer can be patterned from a thermal transfer donor with the application of enough heat during the transfer process to locally heat the transferred portions of the LEP transfer layer so that they become oriented by the active alignment layer.

Another technique may be to coat a mixture or blend of an orientable LEP material and a photopolymer that can be aligned by photocuring using polarized light, such as the photopolymers disclosed by M. Schadt et al., "Surface-Induced Parallel Alignment of Liquid Crystals by Linearly Polymerized Photopolymers," *Jpn. J. Appl. Phys.*, vol 31, p. 2155 (1992). The materials can be coated as a layer onto a donor sheet and suitably cured with light in a manner that causes the photopolymer to orient and act as an orienting matrix for the orientable LEP.

The present invention also contemplates a transfer layer that includes an oriented conductive or semiconductive polymer. Oriented electronically active polymers can be provided by any suitable method including those described above for providing oriented LEPs.

The present invention also contemplates a transfer layer that includes an oriented SM emitter. Orienting SM emitters can be provided by any suitable method including vapor depositing a chiral SM material on the donor sheet, coating a chiral mixture that includes a SM material onto the donor sheet, disposing an orientable SM material in a lyotropic or other orienting matrix and shear coating onto the donor sheet, vapor depositing a thin layer of an orientable SM material onto an anisotropically structured layer of the donor sheet, and the like.

The present invention also contemplates a transfer layer that includes a fluorescent dye or other PL material disposed in an oriented matrix. For example, an orientable fluorescent dye can be disposed in an oriented LEP layer, in an oriented conducting or semiconducting polymer layer such as a layer suitable for use as a charge transport layer in an OEL device, in an orienting lyotropic matrix or other hose matrix, and the like. The PL material disposed in the oriented matrix can be formed onto a donor sheet as a transfer layer or portion thereof.

The present invention also contemplates a transfer layer that includes a transferable functional alignment layer. For example, a hole transport or electron transport material can be coated onto a donor sheet as a transfer layer and brushed, rubbed, or stretched. A charge transport material can also be coated onto a microstructured interlayer of the donor sheet so that upon selective thermal transfer the charge transport layer has a microstructured surface onto which an emissive layer can be formed and oriented, for example.

The oriented transfer layer can then be selectively thermally transferred from the donor element to a proximately located receptor substrate. The receptor substrate may be any item suitable for a particular application including, but not limited to, glass, transparent films, reflective films, metals, semiconductors, and plastics. For example, receptor substrates may be any type of substrate or display element suitable for display applications. Receptor substrates suitable for use in displays such as liquid crystal displays or emissive displays include rigid or flexible substrates that are substantially transmissive to visible light. Examples of suitable rigid receptors include glass and rigid plastic that are coated or patterned with indium tin oxide and/or are circuitized with low temperature poly-silicon (LTPS) or other transistor structures, including organic transistors.

Suitable flexible substrates include substantially clear and transmissive polymer films, reflective films, transflective films, polarizing films, multilayer optical films, and the like. Flexible substrates can also be coated or patterned with electrode materials and/or transistors, for example transistor arrays formed directly on the flexible substrate or transferred to the flexible substrate after being formed on a temporary carrier substrate. Suitable polymer substrates include polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports. For making OELs on plastic substrates, it is often desirable to include a barrier film or coating on one or both surfaces of the plastic substrate to protect the organic light emitting devices and their electrodes from exposure to undesired levels of water, oxygen, and the like.

Receptor substrates can be pre-patterned with any one or more of electrodes, transistors, capacitors, insulator ribs, spacers, color filters, black matrix, and other elements useful for electronic displays or other devices.

Figure 3:
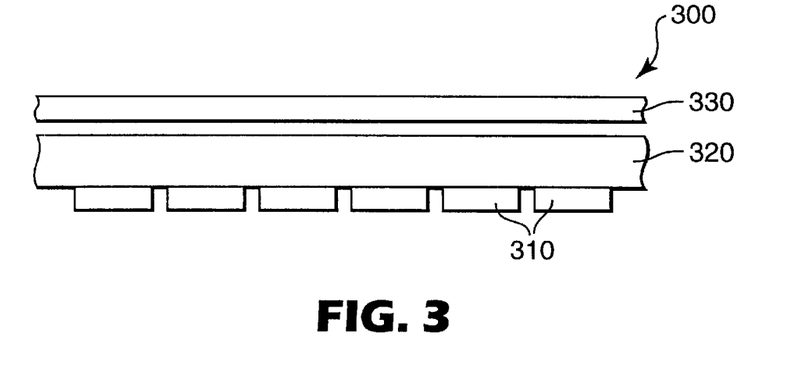
FIG. 3 is a schematic side view of an organic electroluminescent display according to the present invention.

The present invention contemplates polarized light emitting OEL displays and devices. In one embodiment, OEL displays can be made that emit polarized light and that have adjacent devices that can emit light having different color and/or polarization characteristics. For example, FIG. 3 shows an OEL display 300 that includes a plurality of OEL devices 310 disposed on a substrate 320. Adjacent devices 310 can be made to emit different colors of light of the same polarization (e.g., full color RGB display that emits polarized light), the same color of light with different polarization characteristics (including different polarization orientations as well as non-polarized devices adjacent to polarized light emitting devices), or any combination of these.

The separation shown between devices 310 is for illustrative purposes only. Adjacent devices may be separated, in contact, overlapping, etc., or different combinations of these in more than one direction on the display substrate. For example, a pattern of parallel striped transparent conductive anodes can be formed on the substrate followed by a striped pattern of a hole transport material and a striped repeating pattern of red, green, and blue polarized light emitting LEP layers, followed by a striped pattern of cathodes, the cathode stripes oriented perpendicular to the anode stripes. Such a construction may be suitable for forming passive matrix displays. In other embodiments, transparent conductive anode pads may be provided in a two-dimensional pattern on the substrate and associated with addressing electronics such as one or more transistors, capacitors, etc., such as are suitable for making active matrix displays. Other layers, including the light emitting layer(s) can then be coated or deposited as a single layer or can be patterned (e.g., parallel stripes, two-dimensional pattern commensurate with the anodes, etc.) over the anodes and/or electronic devices. Any other suitable construction is also contemplated by the present invention.

In one embodiment, display 300 can be a multiple color display that emits polarized light. As such, it may be desirable to position optional polarizer 330 between the light emitting devices and a viewer, for example to enhance the contrast of the display. In exemplary embodiments, each of the devices 310 emits polarized light that has the same or nearly the same orientation. Polarizer 330 can then be positioned with its transmission axis effectively aligned with the polarization orientation of the light emitted by the devices 310. There are many displays and devices constructions covered by the general construction illustrated in FIG. 3. Some of those constructions are discussed as follows.

Figure 4:
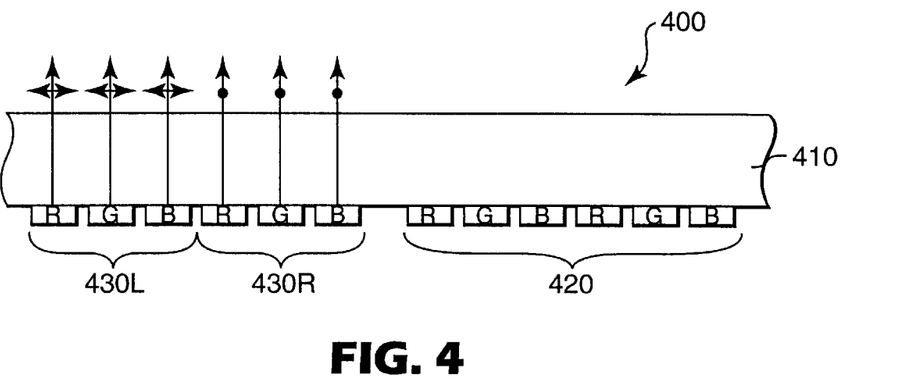
FIG. 4 is a schematic side view of an organic electroluminescent display according to the present invention.

FIG. 4 shows an OEL display 400 that may be suitable for use as a full color stereoscopic display. Display 400 includes a substrate 410 and a plurality of pixels 420. Each pixel includes two RGB subpixels 430L and 430R. Subpixel 430L includes a red, a green, and a blue OEL device that each emits light polarized in the plane of the page, for example, as indicated by arrows (↔). Subpixel 430R includes a red, a green, and a blue OEL device that each emits light polarized perpendicular to the plane of the page, for example, as indicated by dots (•). The images projected by appropriately activating devices in each subpixel pair can be viewed through polarizers, for example a linear polarizer over the right eye of a viewer that allows light from subpixel 430R devices to be transmitted but that blocks light from subpixel 430L devices, and an orthogonally oriented linear polarizer over the left eye of a viewer that allows light from subpixel 430L devices to be transmitted but that blocks light from subpixel 430R devices. Appropriate driving of subpixels across display 400 can provide such a viewer with stereoscopic images. Although FIG. 4 depicts a portion of a full color stereoscopic display, the present invention also contemplates multiple color displays that are less than full color and monochromatic displays. Also, the subpixels can be arranged so that oppositely polarized light emitting devices of the same color are adjacent (e.g., an arrangement of R↔R•G↔G•B↔B• rather than the R↔G↔B↔R•G•B• arrangement shown).

Figure 5:
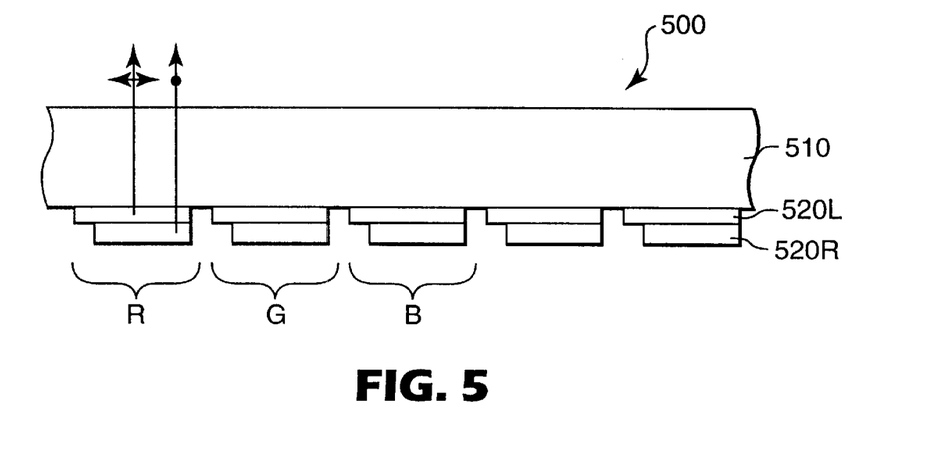
FIG. 5 is a schematic side view of an organic electroluminescent display according to the present invention.

FIG. 5 shows another example of an OEL display 500 that may be suitable for use as a full color stereoscopic display. In display 500, stack subpixels denoted R, G, and B are disposed on substrate 510. Each subpixel has a stacked device construction that includes two devices 520L and 520R, each of which emit the same color of light but at orthogonal polarization states (as indicated by polarization designations ↔ and • for the red (R) subpixel). A viewer can see a stereoscopic image by wearing glasses having oppositely oriented linear polarizers over each eye as described for display 400. Stacked devices can be constructed as disclosed in U.S. Pat. No. 5,707,745. As with the display shown in FIG. 4, display 500 can be full color, multiple color, or monochromatic.

The displays shown in FIGS. 4 and 5 can provide advantages over conventional stereoscopic displays in that the viewer does not need to wear special glasses that must be electronic switched in synchronization with the display in order to see the stereoscopic image. Rather, the viewer can wear "static" glasses (i.e., glasses that are not electronically controlled) that have oppositely oriented linearly polarizing lenses. This allows the display to be spatially modulated rather than temporally modulated. Stereoscopic displays and their uses are described in T. Bardsley and I. Sexton, "Evaluating Stereoscopic Displays for 3D Imaging (Chapter 19)," *Display Systems*, L. W. MacDonald and A. C. Lowe (editors), (1997).

Although the displays shown in FIGS. 4 and 5 have been described for use as stereoscopic displays, they can be used in any application where it is desirable to display one or multiple colors having different (e.g., orthogonal) polarization states. For example, similar displays may be used in projector engines or in other applications where it may be desirable to emit polarized light having different orientations for different colors and/or having multiple orientations for the same color.

Figure 6:
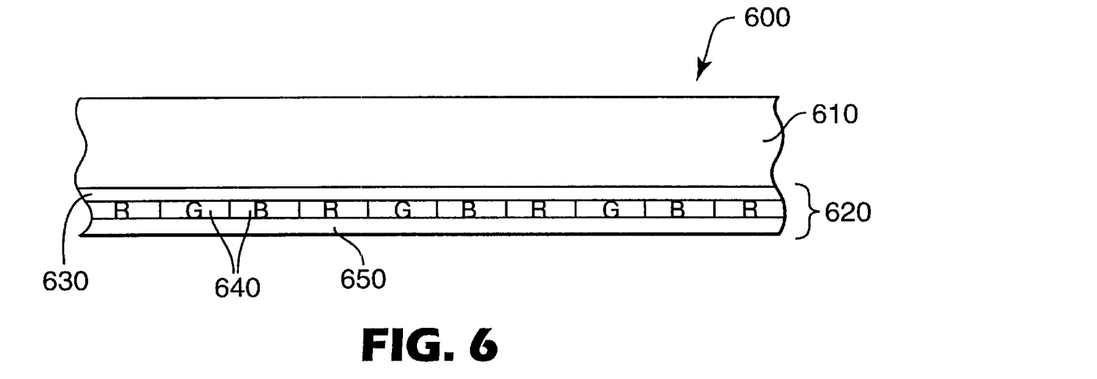
FIG. 6 is a schematic side view of an organic electroluminescent backlight according to the present invention.

FIG. 6 shows an OEL display 600 that can be used as a polarized light emitting lamp or backlight that optionally has color tuning capabilities. Display 600 includes a device layer 620 disposed on substrate 610. Device layer 620 includes a plurality adjacent light emitting layers 640 that can emit different colors of polarized light (e.g., red, green, and blue as indicated in FIG. 6), with the light emitting layers 640 disposed between a first electrode 630 and a second electrode 650. Other layers suitable in OEL devices can also be present. Electrodes 630 and 650 can be patterned to allow for independent activation of a plurality of devices, or electrodes 630 and 650 can be single layers so that all of the light emitting layers emit light when activated. Patterning the electrodes can allow for display 600 to be used as a polarized light emitting backlight whose emitted can be readily tuned to any desired color, including white. Alternatively, when unpatterned electrodes are used, the color of the backlight can be selected by adjusting the proportional coverage of the different light emitting layers. One application for display 600 can be as a polarized white light emitting lamp for LCD backlights.

Figure 7:
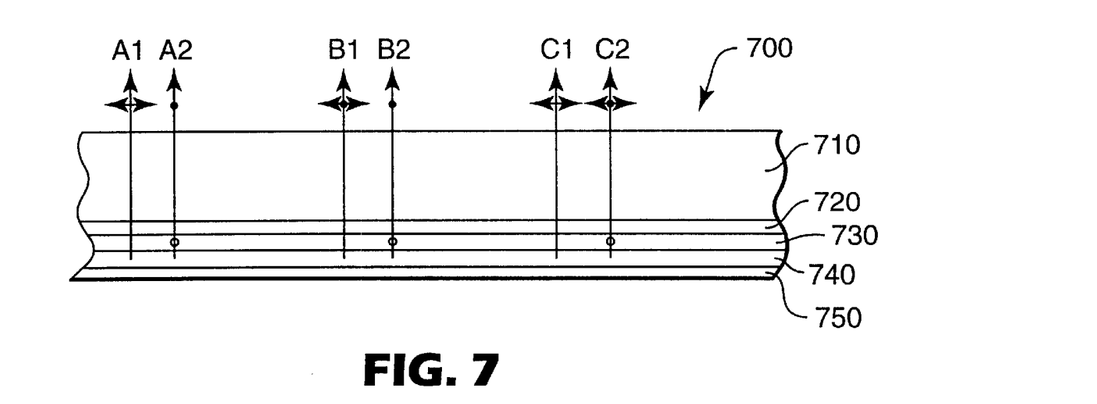
FIG. 7 is a schematic side view of an organic electroluminescent device according to the present invention.

FIG. 7 shows a portion of an OEL device or display 700 that includes a substrate 710, an anode 720, a hole transport layer 730 containing a fluorescent dye disposed therein, an organic electroluminescent layer 740, and a cathode 750. Device 700 is shown as a bottom emitting device for illustrative purposes, and it will be recognized that any suitable device construction can be used. Also, while the fluorescent dye is described as disposed in the hole transport layer, it can alternatively or additionally be disposed in the OEL layer or in an electron transport layer if a top emitting constructions was used. Also, other PL materials might be used in place of or in addition to the fluorescent dye.

Device 700 can operate in a variety of ways as indicated by the three sets of arrows that illustrate light generated by the device. For example, OEL layer 740 may be an oriented emissive layer that emits one orientation of polarized light A1. In such an embodiment, hole transport layer 730 can be an orienting host so that the fluorescent dye disposed therein emits the orthogonal orientation of polarized light A2 when activated by light emitted by the OEL layer 740. The open circles (○) shown breaking lines A2, B2, and C2 in layer 730 indicate activation of a fluorescent dye by a photon emitted by the OEL layer 740. As A2 indicates, the fluorescent dye can be used as a polarization converter in addition to or instead of as a color converter. In another embodiment, OEL layer 740 may be a non-oriented emissive layer so that it emits unpolarized light B1 that can be converted into polarized light B2 by the fluorescent dye in an oriented hole transport layer 730. In another embodiment, OEL layer 740 may be an oriented emissive layer that emits polarized light C1. Hole transport layer 730 can be a non-oriented layer so that the fluorescent dye disposed therein converts the light emitted by the OEL layer 740 into unpolarized light C2.

Figure 8:
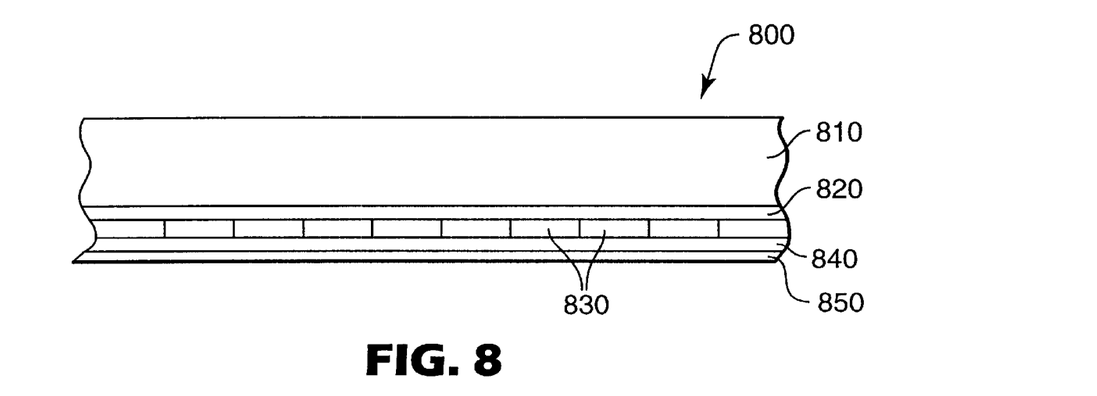
FIG. 8 is a schematic side view of an organic electroluminescent device according to the present invention.

FIG. 8 shows a portion of an OEL display 800 that includes substrate 810, anode 820, a plurality of patterned hole transport layers 830, LEP layer 840, and cathode 850. The hole transport layers are a plurality of oriented hole transport layers patterned, for example, by selective thermal transfer from a donor to the display substrate and anode. The hole transport layers can be patterned so that they exhibit different orientations and/or the hole transport layers can be patterned having different PL materials disposed therein. LEP layer 840 can be coated onto the oriented hole transport layers so that the hole transport layers acts as a plurality of alignment layers. In this way, a plurality of OEL devices can be formed, each of which can emit polarized light having a polarization orientation different from adjacent devices (due to different orientations of the alignment hole transport layer) and/or having a different color than adjacent devices (due to different PL material disposed in adjacently patterned hole transport layers). It is contemplated that the concepts illustrated in FIG. 8 also apply to top emitting OEL devices, to differently constructed bottom emitting OEL devices, and to OEL devices having patterned LEP layers.

The elements, concepts, and functions illustrated in FIGS. 3 through 8 can be mixed and matched to form OEL displays and devices that have unique appearances and functionalities. For example, OEL displays or lamps can be constructed that have a pattern of oriented pixels that emit polarized light embedded in a matrix of pixels that are non-oriented (i.e., emit unpolarized light) or that are randomly oriented (i.e., emit randomly polarized light), so that when the display or lamp is viewed with a polarization analyzer, the pattern of oriented pixels can be revealed. When viewed without a polarization analyzer, the display or lamp could appear as if there were no different among pixels. Such a lamp or display could be used for security applications, for example.

Some of the organic electronic devices that include oriented active organic layers or materials for polarized light emission and/or enhanced electronic properties can fall into one or more of four general categories: OEL backlights, low resolution OEL displays, high resolution OEL displays, and organic transistors.

OEL backlights can include oriented emissive and/or oriented conductive or semiconductive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers (e.g., for clean-up, glare reduction, and the like), diffusers (e.g., polarization maintaining diffusers), light guides, lenses, light control films, brightness enhancement films, and the like. Applications include white or single color large area single pixel lamps, for example where an oriented emissive material is provided by thermal stamp transfer, lamination transfer, resistive head thermal printing, or the like; white or single color large area single electrode pair lamps that have a large number of closely spaced emissive layers patterned by laser induced thermal transfer; and tunable color multiple electrode large area lamps.

Low resolution OEL displays can include oriented emissive and/or oriented conductive or semiconductive layers. Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers (e.g., for clean-up, glare reduction, and the like), diffusers (e.g., polarization maintaining diffusers), light guides, lenses, light control films, brightness enhancement films, and the like. Applications include graphic indicator lamps (e.g., icons); segmented alphanumeric displays (e.g., appliance time indicators); small monochrome passive or active matrix displays; small monochrome passive or active matrix displays plus graphic indicator lamps as part of an integrated display (e.g., cell phone displays); large area pixel display tiles (e.g., a plurality of modules, or tiles, each having a relatively small number of pixels), such as may be suitable for outdoor display used, and as such can be combined with a front polarizer to enhance contrast and reduce glare; and security display applications.

High resolution OEL displays can include oriented emissive and/or oriented conductive or semiconductive layers.

Constructions can include bare or circuitized substrates, anodes, cathodes, hole transport layers, electron transport layers, hole injection layers, electron injection layers, emissive layers, color changing layers, and other layers and materials suitable in OEL devices. Constructions can also include polarizers (e.g., for clean-up, glare reduction, and the like), diffusers (e.g., polarization maintaining diffusers), light guides, lenses, light control films, brightness enhancement films, and the like. Applications include active or passive matrix multicolor or full color displays; active or passive matrix multicolor or full color displays plus segmented or graphic indicator lamps (e.g., laser induced transfer of high resolution devices plus thermal hot stamp of icons on the same substrate); stereoscopic multicolor or full color displays; and security display applications (e.g., displays having oriented emitters plus isotropic emitters, displays having differently oriented emitters, and the like).

Organic transistors can include oriented conductive and/or semiconductive layers. Constructions can include bare or circuitized substrates, gate electrodes, gate dielectrics, organic semiconductors, organic or inorganic source and drain leads, and the like. Applications include RFID tags, transistors for display pixel or sub-pixel control, sensors, and the like.

The present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the instant specification.

Each of the patents, patent documents, and publications cited above is hereby incorporated into this document as if reproduced in full.

What is claimed is:

1. A process for making an organic electroluminescent device comprising:
   selectively thermally transferring a transfer layer comprising an oriented organic emissive material from a donor sheet to a receptor substrate comprising a first electrode; and
   forming a second electrode so that the oriented organic emissive material is positioned between the first and second electrodes,
   wherein the device is capable of emitting polarized light when activated.

2. The process of claim 1, wherein the oriented emissive material comprises an oriented light emitting polymer.

3. The process of claim 1, wherein the oriented emissive material comprises an oriented small molecule emitter.

4. The process of claim 1, wherein the oriented emissive material comprises an oriented fluorescent dye.

5. The process of claim 1, wherein the transfer layer consists essentially of the oriented emissive material.

6. The process of claim 1, wherein the transfer layer comprises the oriented emissive material disposed on an electronically active alignment layer.

7. The process of claim 1, wherein the transfer layer comprises the oriented material disposed in an orienting host matrix.

8. The process of claim 1, wherein the donor sheet comprises a substrate, an interlayer, a light-to-heat conversion layer disposed between the substrate and the interlayer to absorb imaging radiation and convert it to heat, and wherein the transfer layer is disposed adjacent to the interlayer.

9. The process of claim 8, wherein the interlayer remains substantially intact during selective thermal transfer of the transfer layer.

10. A process for making an organic electronic device comprising:
    selectively thermally transferring a transfer layer comprising an oriented electronically active polymer from a donor sheet to a device substrate; and
    electrically connecting the oriented electronically active polymer layer on the device substrate to other layers of the organic electronic device to form a completed device.

11. A method of making a thermal transfer donor sheet comprising providing a donor substrate and light-to-heat conversion layer on the donor substrate and forming a transfer layer adjacent to the light-to-heat conversion layer, the transfer layer comprising an oriented electronically active organic material capable of being selectively thermally transferred from the donor sheet to a proximately located receptor while substantially maintaining the orientation of the oriented electronically active organic material.

12. A donor sheet comprising:
    a selectively thermally transferable transfer layer comprising an oriented organic emissive material capable of emitting polarized light when suitably disposed in an organic electroluminescent device;
    a donor substrate; and
    a light-to-heat conversion layer disposed between the substrate and the transfer layer.

13. The donor sheet of claim 12, further comprising an interlayer disposed between the light-to-heat conversion layer and the transfer layer.

14. The donor sheet of claim 13, wherein the interlayer is used to align the oriented organic emissive material.

15. The donor sheet of claim 12, wherein the transfer layer further comprises an organic charge transport layer.

16. The donor sheet of claim 15, wherein the charge transport layer is an active alignment layer used to align the oriented organic emissive material.

17. The donor sheet of claim 12, wherein the organic emissive material comprises a light emitting polymer.

18. The donor sheet of claim 12, wherein the organic emissive material comprises a small molecule material.

19. The donor sheet of claim 12, wherein the organic emissive material comprises a fluorescent dye.

20. The donor sheet of claim 12, wherein the oriented organic emissive material is disposed in an orienting matrix.

21. A donor sheet comprising:
    a substrate;
    an alignment layer;
    a light-to-heat conversion layer disposed between the substrate and the alignment layer for converting incident imaging radiation into heat; and
    a transfer layer comprising an oriented light emitting polymer coated onto the alignment layer and capable of being selectively thermally transferred from the donor sheet to a proximately located receptor.

* * * * *